United States Patent [19]

Schrenk

[11] Patent Number: 4,835,742
[45] Date of Patent: May 30, 1989

[54] WORD-BY-WORD ELECTRICALLY REPROGRAMMABLE NON-VOLATILE MEMORY AND METHOD OF OPERATION THEREOF

[75] Inventor: Hartmut Schrenk, Haar, Fed. Rep. of Germany

[73] Assignee: Siemens Aktiengesellschaft, Berlin and Munich, Fed. Rep. of Germany

[21] Appl. No.: 99,660

[22] Filed: Sep. 21, 1987

Related U.S. Application Data

[63] Continuation of Ser. No. 840,996, Mar. 17, 1986, abandoned, which is a continuation of Ser. No. 465,531, Feb. 10, 1983, abandoned.

[30] Foreign Application Priority Data

Feb. 16, 1982 [DE] Fed. Rep. of Germany ....... 3205476

[51] Int. Cl.$^4$ .............................................. G11C 7/00
[52] U.S. Cl. .............................. 365/189.07; 365/201; 365/238.5
[58] Field of Search ............... 365/182, 185, 189, 201, 365/203, 218, 230, 233

[56] References Cited

U.S. PATENT DOCUMENTS

| 4,087,795 | 5/1978 | Rossler | 365/185 |
| 4,279,024 | 7/1981 | Schrenk | 365/203 |

OTHER PUBLICATIONS

W. S. Johnson et al., "16-K EE-PROM Relies on Tunneling for Byte-Erasable Program Storage", Electronics, Feb. 28, 1980, pp. 113–117.

*Primary Examiner*—Joseph A. Popek
*Attorney, Agent, or Firm*—Herbert L. Lerner; Laurence A. Greenberg

[57] ABSTRACT

Word-by-word electrically reprogrammable non-volatile memory includes an array in matrix form of memory cells containing respective storage transistors, the storage transistors having reading windows of different widths, respectively, in at least two subregions of the memory and a method of operation thereof.

18 Claims, 2 Drawing Sheets

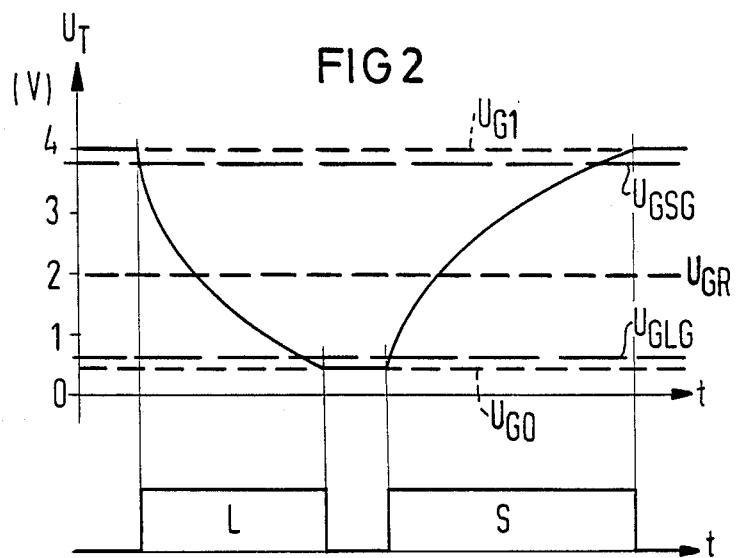
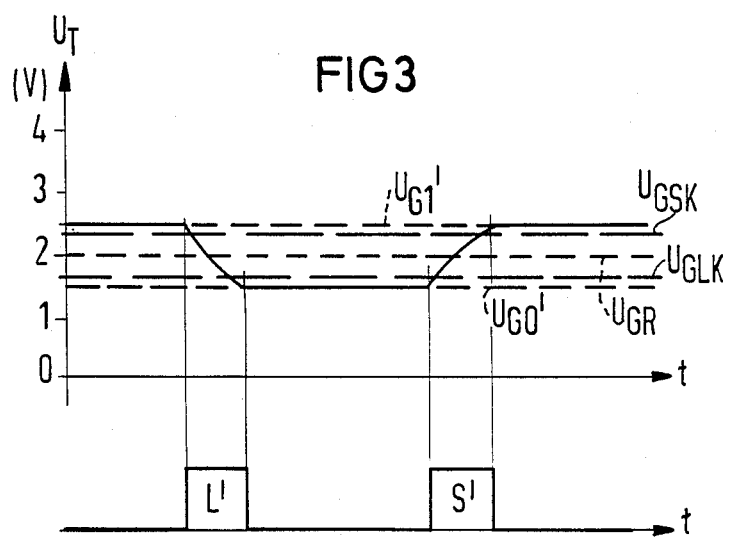

WORD-BY-WORD ELECTRICALLY REPROGRAMMABLE NON-VOLATILE MEMORY AND METHOD OF OPERATION THEREOF

This application is a continuation of application Ser. No. 840,996, filed Mar. 17, 1986, now abandoned, which is a continuation of application Ser. No. 465,531, filed Feb. 10, 1983, now abandoned.

The invention relates to a word-by-word electrically reprogrammable non-volatile memory with storage cells arranged in the form of a matrix and containing storage transistors, as well as to a method of operation thereof.

Such non-volatile memories are known, for example, from German Pat. No. 24 45 137 (U.S. Pat. No. 4,087,795) or the periodical Electronics, Feb. 28, 1980, Pages 113 to117. In practice, the use of non-volatile electrically reprogrammable memories, generally known as EEPROMSs, is subject to limitations. For one thing, electrical reprogramming demands a considerable amount of time which is between 1 ms and 1 s for commercially available products. Secondly, electrical reprogramming leads to aging of the EEPROMs, which has an adverse effect both on the programming properties as well as on the preservation of the data.

In many applications of non-volatile data storage, individual parts of the information to be stored are selectively changed more frequently. At the same time, the requirements as to data preservation are less stringent for them. This is evident, for example, in the case of an electronic counter with a non-volatile storage of the count, for example, an electronic kilometer-counter. The higher-value or more-significant digits of the counter reading are seldom reprogrammed. The programming time and the permissible reprogramming frequency therefore play a secondary role. Decisively important, however, is good long-term data preservation. The lower-value or less significant digits of the counter reading change frequently. A short programming time and a great number of permissible reprogramming actions are more important than data preservation over long periods of time.

This problem could not be solved satisfactorily heretofore. On the one hand, memories such as NMOS memories, for example, have been used which basically afford a great number of permissible reprogrammings, yet exhibit poor data preservation. On the other hand, different addressing regions of the EEPROM memory have been used sequentially for the frequently changing information which, however, increases the space requirements of the memory.

If it is understood that the broadness or width of the reading window of an EEPROM memory means the margin of the cut-off voltages (threshold voltages) to be measured at the gate of the storage transistors in the cleared or erased and written and, respectively, unprogrammed and programmed state, then the read-out voltage to be applied to the gate of a storage transistor must lie within this reading window. The invention of the instant application then proceeds from the fact that the broadness or width of the reading window influences the number of permissible reprogramming actions of storage cells in several ways.

The damage to a storage cell depends, for one thing, upon the duration of the applied erase and write voltage, respectively, and thus directly upon the width of the reading window.

The invention then starts from the idea that the aging of the storage cells can be reduced by controlling the reprogramming processes over the breadth or width of the reading window and, in addition, the advantage of the shorter minimum programming time for a smaller reading window is enjoyed but, for that, the disadvantage of a smaller margin of safety against data losses must be taken into consideration.

It is accordingly an object of the invention to provide a word-by-word electrically reprogrammable non-volatile memory and method of operation thereof which solves the problem of storing data which occur with different frequency and different requirements as to the preservation of data, such as short programming time for frequently occurring data and long data preservation, for example, for more seldom occuring data, in a memory of the general type mentioned at the introduction to this specification.

With the foregoing and other objects in view, there is provided, in accordance with the invention, a word-by-word electrically reprogrammable non-volatile memory comprising an array in matrix form of memory cells containing respective storage transistors, the storage transistors having reading windows of different widths, respectively, in at least two subregions of the memory.

Thereby, the electrical reprogramming of an EEPROM is carried out in such a way that the non-volatile shift of the cut-off voltage of a storage transistor, which effects the storage, occurs in the positive or negative direction for subregions of the memory field, to different extents. Those storage or memory cells which are reprogrammed more seldomly, but require reliable data retention, can be rewritten with a wide reading window, while the storage or memory cells which are reprogrammed frequently, but the data preservation of which is of comparatively less importance, may be given a narrower reading window. Thus it is possible, for one thing, to reduce aging phenomena considerably and, for another, to decrease the programming times distinctly.

In accordance with another feature of the invention, there is provided a respective driving circuit for erasing and writing connected to the storage transistors for each of the subregions of the memory, the driving circuits being operable with different clearing and writing times.

In accordance with a further feature of the invention, there are provided means for fixing an end to the erasing and writing times by controlling attainment of given erasing and writing states of at least one of the storage cells for the respective subregion of the memory which is to be erased and written, respectively.

In accordance with an added feature of the invention, the attainment of the given erasing state is fixable by comparing the threshold voltage of the storage transistor with a given erasing control voltage, each subregion of the memory having an erasing control voltage of different magnitude.

In accordance with an additional feature of the invention, the attainment of the given writing state is fixable by comparing the threshold voltage of the storage transistor with a given writing control voltage, each subregion of the memory having a writing control voltage of different magnitude.

In accordance with again another feature of the invention, there are provided means for addressing each subregion of the memory with programming voltages of different magnitude for erasing and writing.

In accordance with again a further feature of the invention, the storage cells of each of the subregions of the memory have constructions in different technologies.

In accordance with again an added feature of the invention, there is provided a memory having two subregions, the reading window in one of the subregions being wider by at least one order of magnitude than the reading window in the other of the subregions.

In accordance with a concomitant feature of the invention, there is provided a memory forming part of an electronic counter with non-volatile storage of readings of the counter.

Other features which are considered as characteristic for the invention are set forth in the appended claims.

Although the invention is illustrated and described herein as embodied in a word-by-word electrically reprogrammable non-volatile memory and method of operation thereof, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 2 is a plot diagram of the waveform of the threshold voltage of a storage transistor of the memory of FIG. 1 as well as the erasing and writing time for a broad or wide reading window; and FIG. 3 is a plot diagram of the waveform of the threshold voltage of a storage transistor of the memory of FIG. 1 as well as the erasing time and the writing time for a narrow reading window.

In the figures, like elements are provided with the same reference characters.

Figure 1:
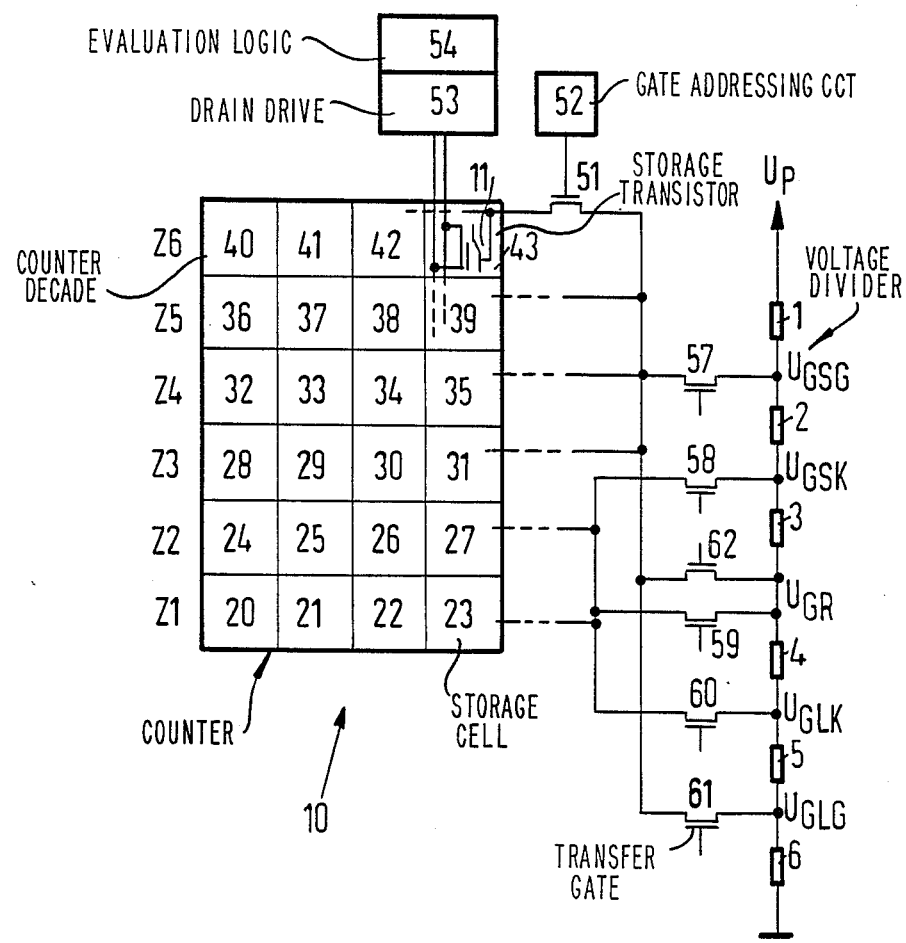
FIG. 1 is a circuit diagram of an embodiment of a memory according to the invention.

Referring now to the drawing and, first, particularly to FIG. 1, there is shown a circuit diagram of a portion of an embodiment of an electric counter with non-volatile memory of six counting decades in an EEPROM 10. The EEPROM 10 consists, in this case, of twenty-four storage cells 20 to 43 arranged in matrix form, each of which having a storage transistor 11. A storage cell, as is known from Electronics, Feb. 28, 1980, Pages 113 to 117, may also be formed of a storage transistor 11 and a selection transistor, not illustrated in FIG. 1 for reasons of clarity. Four storage cells, respectively, and, thereby, four bits form a counter decade, so that with six counter decades $Z_1$ to $Z_6$ arranged as rows, six numerals can be stored if a BCD code is used. Such a counter can be employed, for example, as a kilometer-counter. For reasons of clarity, only one storage transistor 11 is shown in FIG. 1.

According to the invention, the storage transistors 11 of the storage cells of the memory 10 have reading windows of different width or breadth in two subregions of the memory 10. In the illustrated case, a wide reading window is provided for the storage cells 28 to 43 belonging to the counter decades $Z_3$ to $Z_6$, and a narrow reading window for the storage cells 20 to 27 belonging to the counter decades $Z_1$ and $Z_2$, a reading window being understood to mean the difference (as to absolute value) of the cut-off voltage of a storage transistor 11 in the programmed state and the cut-off voltage in the unprogrammed state.

The width of the reading windows of the storage transistors of the cells 20 to 43 can be controlled, for example, by a programming time control shown in detail in U.S. Pat. No. 4,279,024. The timing control described in the latter publication operates in such a manner that an addressing circuit connected to the memory matrix 10 provides variable erasing and writing periods or times for each memory row $Z_1$ to $Z_6$, the end of those periods or times being indicated by the attainment of a predetermined erasing and writing state, respectively, of one or more storage cells from the storage or memory now to be erased or written, the erasing and writing state, respectively, of one or more storage cells of the memory row to be erased and to be written, respectively, being controlled during the erasing and writing time, respectively, of this memory row.

The drive can be connected to the memory matrix in such a manner that, to attain a variable erasing time of a storage cell and to control the erased state of one or more storage cells of the row to be erased, the erasing voltages present at the storage cells are divided into a sequence of individual pulses, so that a respective control-read process can be inserted into the pulse pauses. However, simultaneously erasing and control-reading can also be performed.

According to the aforementioned German Published Non-Prosecuted Application (DE-OS) No. 28 28 855, the drive is connected to the memory matrix in such a manner that the erasing time of a storage cell terminates if all the storage cells at which a control-reading is performed have a threshold voltage of $U_T$, where $U_T$ is smaller than or equal to $U_{GL}$ which is a predetermined threshold value of the storage cells used.

The same applies to the addressing circuit for obtaining a variable writing time which, therefore, is so constructed that the writing time of a storage or memory row is terminated if all the storage cells at which control-reading is performed have a threshold voltage $U_T$ greater than or equal to $U_{GS}$ which is a predeterminable write-control voltage.

In order to ensure a safe minimum margin between the gate voltage $U_{GR}$ which is required for reading-out and which is to be applied to the gate of the storage transistor 11, the gate voltages which are required as predetermined threshold voltage values ($U_{GS}$ and $U_{GL}$) for control-reading in programming and clearing, as well as the gate voltage for reading out the storage cells ($U_{GR}$) are advantageously taken from one and the same voltage divider, so that the condition $U_{GL}$ smaller than $U_{GR}$ and, simultaneously, the condition $U_{GR}$ smaller than $U_{GS}$ are always met.

Regarding further details and, particularly, the technological realization of the source-drain addressing circuits, which have not been shown in FIG. 1 for reasons of clarity of presentation, the evaluation logic system, the gate addressing circuit and the control circuit with the pulse section, reference is made to the detailed presentation in the aforementioned U.S. Pat. No. 4,279,024.

The programming time control is thus executed in such a manner that, during the reprogramming cycle, the respective position of the cut-off voltage (threshold voltage) $U_T$ of a storage transistor 11 is compared with a predetermined control-reading voltage $U_{GLG}$ and a predetermined control-write voltage $U_{GSG}$, respectively, as shown in the upper part of FIG. 2. If the threshold voltage $U_T$ lies above the threshold voltage in the programmed state $U_{G1}$, then, in the case of n-channel MOS technology, the storage transistor 11 is reliably cut off. For a threshold voltage $U_T$ smaller than the cut-off voltage $U_{GO}$ in the unprogrammed state, the storage cell is analogously certainly conducting at the change between the conducting and the cut-off state, it can therefore be distinguished whether the storage cell has attained a desired programming state under given control conditions. By fixing the control voltages $U_{GSG}$ and $U_{GLG}$, the voltages $U_{G1}$ and $U_{GO}$, respectively, and thereby the breadth or width of the reading window are fixed relative to the read-out voltage $U_{GR}$. Thus, the cut-off voltages of the storage cell for erasing and writing, respectively, can be set in a defined manner. The required erasing time L and writing times S are represented in the lower part of FIG. 2.

For the higher digits of the counter, for example, as assumed for the counter decades $Z_3$ to $Z_6$ in the illustrated embodiment of the invention, a wide reading window which, in the case of a floating-gate memory, amounts to several volts, i.e. the reading window in FIG. 2 ($U_{G1}-U_{GO}$) is several volts, selected with a view to data preservation. For the less significant digits i.e., the counter decades $Z_1$ and $Z_2$, the requirements as to data preservation are less stringent. A reduced reading window ($U_{G1}'-U_{GO}'$) of a few tenths of a volt, as shown in FIG. 3, is sufficient. Such a reduced reading window is obtained by selecting the writing control voltage $U_{GSK}$ and the reading control voltage $U_{GLK}$ so that the control voltages are closer to the read voltage $U_{GR}$ when compared to the control voltages $U_{GSG}$ and $U_{GLG}$ for a large reading window. With the smaller or narrower reading window, the erasing time L' and the writing time S' are reduced, as shown at the bottom of FIG. 3.

Because of the asymptotic course of the clear and write curves, respectively, the smaller or narrower reading window has a great influence upon the programming time, as is apparent from FIGS. 2 and 3. In addition, the reduction of the maximum potential differences by the insulating layers of the storage transistor in the amounts ($U_{G1}-U_{G1}'$) and ($U_{GO}'-U_{GO}$), respectively, improves the aging behavior for fixed external voltages to such an extent that a permissible programming frequency of $10^4$ programming cycles under normal conditions is increased under conditions according to the invention to $10^6$ and is therefore sufficient for a 6-decade counter.

The representation in FIGS. 2 and 3 relates to the use of n-channel MOS floating-gate storage transistors programmable by means of channel injection, upon which the embodiment illustrated and described in the aforementioned U.S. Pat. No. 4,279,024 is also based. If n-channel transistors which are programmed by means of a tunnel effect are used, as described, for example, in the aforementioned periodical Electronics, Feb. 28, 1980, Page 113 to 117, the threshold voltage $U_{G1}$ is characterized by the erased state and the threshold voltage $U_{GO}$ by the written state.

If a programming time control isused, the read control voltages and the write control voltages, and the read voltage $U_{GR}$ are advantageously generated via a common voltage divider which fixes the sequence of the voltages unchangeably. A suitable voltage divider, which is formed of a series connection of resistors 1, 2, 3, 4, 5 and 6, is shown in FIG. 1. That lead of the resistor 1 which is not connected to the resistor 2 is connected to a supply voltage $U_p$ which is greater than the voltage $U_{GSG}$. That lead of the resistor 6 which is not connected to the resistor 5 is grounded. The control writing voltage for generating a large or wide reading window $U_{GSG}$ then lies between the resistors 1 and 2; and between the resistors 2 and 3, the write control voltage for generating a small or narrow reading window $U_{GSK}$; between the resistors 3 and 4, the read voltage $U_{GR}$ proper; between the resistors 4 and 5, the read control voltage $U_{GLK}$ for generating a small or narrow reading window; and between the resistors 5 and 6, the read control voltage $U_{GLF}$ for generating a wide reading window. The control voltages $U_{GSG}$ and $U_{GLG}$ and the read voltage $U_{GR}$, via the transfer gates 57, 62, and 59 and a further transfer gate 51 which can be controlled via a row decoder of the gate-driving circuit 52, can then drive the gate of a storage transistor 11 which is to have a wide reading window. This applies to the counter decades $Z_3$ to $Z_6$ with the storage cells 28 to 43 according to FIG. 1. The gate electrodes of the storage transistors with a narrow reading window (cells 20 to 27) are addressed by the voltages $U_{GSK}$, $U_{GLK}$ and $U_{GR}$ via the transfer gates 58, 60 and 59 and a further transfer gate which corresponds to the transfer gate 51 but is not shown in the figure for reasons of clarity. The transfer gates 51, 57, 58, 59, 60, 61 and 62 are addressed by means of a gate-addressing circuit 52 which can be realized in accordance with the gate addressing circuit described in the aforementioned U.S. Pat. No. 4,279,024.

The evaluation logic 53 which is connected to the source terminals and the drain terminals of the storage transistors 11 and the source and drain drive 54 can likewise be realized in accordance with the evaluation logic and source and drain drive described in the aforementioned U.S. Pat. No. 4,279,024. For each subregion of the memory 10 which has a different reading window, however, a separate evaluation logic must be provided. Correspondingly, for each memory subregion which has a different reading window width, a different read control voltage and a different write control voltage must be provided.

Reading windows of the storage transistors having different widths of subregions of the storage field 10 and, thereby, programmings of different intensity of individual subregions of the storage field can also be achieved by measures other than the programming time control represented hereinabove.

Thus, subregions of the memory field 10 can be addressed by programming voltages of different magnitude for erasing and writing, high programming voltages leading to wider reading windows, in comparison with lower programming voltages. It is further provided according to the invention to construct the storage cells in subregions of the memory field with a different technology, so that the reading windows thereof have different widths. This can be accomplished by different geometric layout of the storage cells in individual subregions. Thus, smaller oxide thicknesses under the floating gate lead to more intense tunnel effects and, therefore, to wider reading windows. Increased capacitive coupling of the floating gate causes, for example, likewise an enlargement of the reading window.

The arrangements for obtaining the different reading window widths may either be arranged in the memory module itself, or it is also possible to provide these arrangements externally and to thus operate in accordance with the invention, for example, commercially available EEPROM memories, wherein the gate terminals of the storage transistors are accessible.

In a memory according to the invention, which contains two subregions with different reading-window widths, the reading window width of the one subregion is advantageously selected at least one order of magnitude smaller or narrower than that of the other subregion. The read voltage $U_{GR}$ must not be in the center of the reading window because the aging of EEPROMs takes place asymmetrically due to the discharging programmed state.

The invention may be employed in EEPROMs which use floating-gate storage cells, as well as in EEPROMs which use, for example, MNOS storage cells.

I claim:

1. A non-volatile memory comprising a plurality of words, and being word-by-word electrically programmable, the words being arranged as an array in matrix form of memory cells, the cells having respective storage transistors for storing data, said storage transistors having reading windows, and at least two subregions, each subregion including at least one word, having transistors having reading windows of different widths.

2. Memory according to claim 1 wherein the storage transistors have control gates, including a gate control circuit for erasing data from and writing data into the storage transistors of each of the respective subregions, the gate control circuits being operable with different erasing and writing times for the respective subregions.

3. Memory according to claim 2, comprising means for determining an end to the erasing and writing times by determining attainment of given erasing and writing states under given control conditions of at least one of the storage transistors for the respective subregion of the memory which is to be erased and written, respectively.

4. Memory according to claim 3, wherein the storage transistors have threshold voltages, the memory including means for attaining a given erasing state which is fixable by comparing the threshold voltage of the storage transistor with a given erasing control voltage, each subregion of the memory having an erasing control voltage of different magnitude.

5. Memory according to claim 3, wherein the storage transistors have threshold voltages, the memory including means for attaining a given writing state which is fixable by comparing the threshold voltage of the storage transistor with a given writing control voltage, each subregion of the memory having a writing control voltage of different magnitude.

6. Memory according to claim 2, including means for addressing each subregion of the memory with programming voltages of different magnitudes for erasing and writing.

7. Memory according to claim 1, wherein the storage transistors of each of said subregions of the memory have different geometrical layouts.

8. Memory according to claim 1 wherein the reading window in one of said subregions is wider by at least one order of magnitude than the reading window in the other of said subregions.

9. Memory according to claim 1, wherein said memory cells form an electronic counter for non-volatile storage of the state of the counter.

10. Method of operating a word-by-word electrically reprogrammable non-volatile memory which includes an array in matrix form of memory cells containing respective storage transistors, means for connecting data to the storage transistors, said storage transistors having reading windows of different widths, respectively, in at least two subregions of the memory, said memory cells having given reprogramming times in relation to the window width, the method which comprises the steps of: erasing and writing the data respectively in and into the transistors of at least one subregion through a reading window of a given width, and erasing and writing the data respectively in and into the transistors of at least one other subregion through a reading window having a width being different from said given width.

11. Method according to claim 10 including a respective driving circuit for reprogramming the memory cells for each of said subregions, comprising the step of operating said driving circuit with different reprogramming times corresponding to said given reading window width and said different width.

12. Method according to claim 11, including means for determining an end to the reprograming times by controlling an attainment of given erasing and writing states of at least one of the storage cells for the respective subregion of the memory which is to be erased and written, comprising the steps of: determining the attainment of a given erase and write state of at least one of the storage cells for the respective subregion of the memory; and terminating the respective erase and write time upon said attainment of said states.

13. Method according to claim 12 including means for comparing a threshold voltage of the storage transistor with a given erasing control voltage, wherein the subregions of the memory has erasing control voltages of different magnitudes, comprising the steps of: comparing said threshold voltage with said erasing control voltage; and fixing said erasing control voltage upon attainment of said given erase state.

14. Method according to claim 13 including means for comparing the threshold voltage of the storage transistor with a given writing control voltage, wherein each subregion of the memory has a writing control voltage of a different magnitude, comprising the steps of: comparing said threshold voltage with said writing control voltage; and fixing said writing control voltage upon attainment of said given state.

15. Method according to claim 11, including means for addressing each subregion of the memory with programming voltages of different magnitudes for erasing and writing data, comprising the steps of: addressing each subregion with said addressing means; and erasing and writing the data respectively in and into said addressed memory cells.

16. Method according to claim 10, comprising the steps of constructing the storage cells of each of said subregions with different geometrical layouts.

17. Method according to claim 10 comprising the step of selecting the width of the reading window in one of said subregions to be greater by at least one order of magnitude than the reading window of the other one of said subregions.

18. Method according to claim 10 wherein said array forms an electronic counter having subregions, comprising the steps of forming at least one of said subregions of said electronic counter of said memory cells for non-volatile storage of data in the counter.

* * * * *